(12) United States Patent
Joshi

(10) Patent No.: US 9,116,190 B2
(45) Date of Patent: Aug. 25, 2015

(54) TURN-TWIST APPARATUS REVEALING CURVATURE AND TORSION OF THE MAGNETIC FIELD

(71) Applicant: Ramesh L. Joshi, Fremont, CA (US)

(72) Inventor: Ramesh L. Joshi, Fremont, CA (US)

(*) Notice: Subject to any disclaimer, the term of this patent is extended or adjusted under 35 U.S.C. 154(b) by 495 days.

(21) Appl. No.: 13/621,801

(22) Filed: Sep. 17, 2012

(65) Prior Publication Data

US 2013/0069643 A1    Mar. 21, 2013

Related U.S. Application Data

(60) Provisional application No. 61/535,906, filed on Sep. 16, 2011.

(51) Int. Cl.
*G01R 33/12* (2006.01)
*G01R 33/00* (2006.01)

(52) U.S. Cl.
CPC ........................ *G01R 33/00* (2013.01)

(58) Field of Classification Search
CPC .................................................... G01R 33/12
USPC ........................................................ 324/261
See application file for complete search history.

(56) References Cited

U.S. PATENT DOCUMENTS

| | | | | |
|---|---|---|---|---|
| 3,350,699 A | * | 10/1967 | Schmidt | 360/78.04 |
| 3,593,120 A | * | 7/1971 | Mandula et al. | 324/261 |
| 4,943,166 A | * | 7/1990 | Yamashita | 369/30.03 |
| 5,450,257 A | * | 9/1995 | Tran et al. | 360/76 |
| 5,889,215 A | * | 3/1999 | Kilmartin et al. | 73/862.335 |
| 6,339,522 B1 | * | 1/2002 | Hoelsaeter | 360/291 |
| 2003/0016781 A1 | * | 1/2003 | Huang | 378/41 |
| 2007/0040552 A1 | * | 2/2007 | Ishimoto | 324/261 |
| 2012/0060625 A1 | * | 3/2012 | Dietz | 73/861.42 |

\* cited by examiner

*Primary Examiner* — Bot Ledynh
(74) *Attorney, Agent, or Firm* — Craig M. Stainbrook; Stainbrook & Stainbrook, LLP

(57) ABSTRACT

An apparatus for observing turns and twists in magnetic phenomena including a nonferrous box, a stationary platform set in the middle of the box with a post to support a magnet, a right-hand and a left-hand screws united with coupling and having moving platforms at equal distance from the middle fixed platform with posts to support the specimen, the specimen poized by the magnetic field, and to hover the specimen move the platforms back and forth in continuous and intermittent motions, dc stepper motor to provide the motion, and controlled by power supply, push button switches, and limit switches.

15 Claims, 2 Drawing Sheets

TURN-TWIST APPARATUS REVEALING CURVATURE AND TORSION OF THE MAGNETIC FIELD

CROSS REFERENCES TO RELATED APPLICATIONS

The present application claims the benefit of U.S. Provisional Patent Application Ser. No. 61/535,906, filed Sep. 16, 2011.

STATEMENT REGARDING FEDERALLY SPONSORED RESEARCH OR DEVELOPMENT

Not applicable.

THE NAMES OR PARTIES TO A JOINT RESEARCH AGREEMENT

Not applicable.

INCORPORATION-BY-REFERENCE OF MATERIAL SUBMITTED ON A COMPACT DISC

Not applicable.

BACKGROUND OF THE INVENTION

1. Field of the Invention

The present invention relates generally to scientific instrumentation and measurement devices, and more particularly to devices for detecting and measuring magnetic fields, and still more particularly to an apparatus for demonstrating that magnetic fields are not limited to field-lines, but instead include field-curves having torsional features.

2. Background Discussion

Current magnetic hard disk drive storage devices use the conventional concept of Faraday's magnetic field-lines. The magnetic media stores the data, and read-write heads retrieve and write the digital information through the magnetic forces working along a line and not on a curve. However, ideally the magnetic forces and the read-write process should not restrict storage and retrieval due to the linearity of the magnetic field; rather, the field concept needs extension for use in designing improved read-and-write performance of horizontal and vertical magnetic storage apparatus.

BRIEF SUMMARY OF THE INVENTION

The present invention is an apparatus and method for demonstrating certain magnetic phenomena. The novel apparatus shows that the magnetic field is not limited to field-lines, but includes, instead field-curves that include torsional features. The turning of the field-curves (which are fixed under normal conditions for Newtonian fluids) for the magnetic fields have torsion even though the electrons are in steady state motion. The torsion of the magnetic fields is not easily observable, either in investigation or in application in storage devices.

The turn-torsion apparatus of the present invention experimentally demonstrates how Faraday's basic concept of magnetic field-lines can be replaced with a generalized concept of three dimensional curves having a turn and torsion (twist) characteristic in the space surrounding the field source. The inventive apparatus shows that the magnetic poles and their associated fields are actually united. As a practical application, and importantly, the apparatus provides a means to improve the currently used read-and-write properties of horizontal and vertical magnetic storage.

An understanding of the above-mentioned turn-torsion properties facilitates: (1) determinations regarding the conditions under which read-write heads will not damage the storage disk; (2) improvements to the read and write properties of the storage; (3) reductions in hard disk magnetic grain size; (4) increases in storage; and (5) applications to three dimensional storage on media other than rotating disks.

In a preferred embodiment, the present invention makes it possible to observe the torsion (twist) in the curved magnetic field lines. A pair of flat ferrous horseshoes (or horseshoes made from cobalt, nickel, or any metal or metal alloy with unpaired electrons) have non-ferrous mounting rods or pins fixed to and extending radially outward from the horseshoe apex (center of the toe) in the plane of each arm. The mounting rods are pivotally attached to support posts. The horseshoes are then moved back and forth on each side of a magnet positioned midway between the paired horseshoes. By moving the horseshoes back and forth in front of the magnet, the magnetic field of the magnet and the magnetic flux of the moving ferrous material create a magnetic induction, thus causing the horseshoes to rotate, turn and twist on their respective mounting rods. The reciprocating (back and forth) motions of the horseshoes toward and away from the magnet show the strength of the magnetic field curves, which may be described, in part, by the rate of rotation of the horseshoes as a function of the distance from the magnet as that distance constantly changes. In this way, the novel apparatus shows that magnetic field curves are not straight but are instead continuously turning from the magnet to the horseshoes, and the motion of the horseshoes turns along the magnetic field curves.

In the immediate vicinity of the magnet the magnetic field lines have curvature. The curvature makes it appear that the field line is turning, and such turning is actually observable through the rotation of the horseshoes. Systems of neighboring curved field lines create surfaces, similar to the constant positional surfaces. When moving further away from the magnet, the curves move out of the magnetic field surfaces and torsion is introduced in the curves. The torsion in the curves is visible when the horseshoes are moved away from the neighborhood, or outside of the boundary of the magnet. However, in close proximity to, and inside the boundary of the magnet, rotation of the horseshoes shows that the magnetic field lines have constant curvature and no torsion.

Obviously, the size of the neighborhood of the curved surfaces depends on the size and strength of the magnets. The larger or stronger the magnet, the stronger the magnetic field, and the larger will be the surfaces having curvature. The curvature decreases as the horseshoes are moved away from the magnet.

By carefully moving the horseshoes in proximity to the magnet, the constant curvature of the magnetic field lines is observable using the inventive apparatus. To observe the torsion (twist) of the magnetic field curves, similar to the torsion in right-hand and left-hand screws, a torsional (twisting) movement may be introduced in the horseshoes. For simplicity, the twists are oriented on the same side of the centerline of the horseshoes. While moving the horseshoes continuously, it is difficult to observe the torsion of the magnetic field curves. However, the torsion is readily observable when moving the horseshoes intermittently—in very small incremental steps—so that the moving platform moves only a small step and the horseshoes make very small rotational motions on their respective pivotal mounting rods. A DC stepper-motor provides the required incremental motion. When the motor is moved a step, both of the horseshoes rotate only a few degrees, partially turning around their own axis, thus revealing the torsion (twist) of the magnetic field curves. In this way, the apparatus of the present invention demonstrates that the magnetic field curves have torsions.

To observe that the torsions on two magnetic curves symmetrically located relative to the center line of the magnet are equal and opposite, the apparatus introduces a twist, also symmetrical on both sides, but oriented oppositely relative to the centerline of the horseshoes. When the horseshoes are moved a step at a time, the horseshoe on one side of the pole twists in a direction opposite the direction turned by the horseshoe on the other side. This shows that the two magnetic curves, symmetrically located on one side of the pole, have an equal and opposite twist. Due to these facts, the magnetic field locally satisfies one of the Maxwell's equations—namely, that the divergence of the magnetic field is zero. The apparatus also shows that the magnetic field has a local turn and twist on one of curves equal and opposite to that of a curve located on the opposite side of the centerline of the magnetic field. The apparatus of the present invention therefore demonstrates that the magnetic field has a pair of curves located on both sides of the centerline of the magnetic field that have equal and opposite torsion.

The turn and torsion, for all curves, are independent of the symmetry of the curves as they have to satisfy the divergence of the field to be zero. The turn and torsion of a curve are created in such a way that for a given turn and torsion of a curve, there is always equal and opposite turn and torsion available in the neighborhood, such that the total resultant of the divergence is zero.

A minimum of two unpaired electrons are required to have a magnetic field. So, the center line of the magnetic field lies between two or three or four unpaired electrons, which are always away from the centerline of the magnetic field. The magnetic field curves are always in pair and symmetrically located to the centerline. Due to these characteristics, the centerline is fictitious, while the magnetic field curves turn and have torsion. The apparatus of present invention shows that the magnetic curves are in pairs and are symmetrically located on the centerline of the magnetic field from a pole.

There is an additional anti-symmetry in the magnetic field from both the poles. This anti-symmetry appears when rotations and turnings are observed simultaneously on both sides of the poles. As the carriages are moving back and forth, the rotations and the turning of the horseshoes are in opposite directions. Thus, there are equal and opposite pairs of curves from both the poles, and satisfy the global divergence of the magnetic field to be zero. This apparatus of the present invention demonstrates that the magnetic field on one side of the pole is equal and opposite of that on the other side.

BRIEF DESCRIPTION OF THE SEVERAL VIEWS OF THE DRAWINGS

The invention will be better understood and objects other than those set forth above will become apparent when consideration is given to the following detailed description thereof. Such description makes reference to the annexed drawings wherein.

Figure 1:
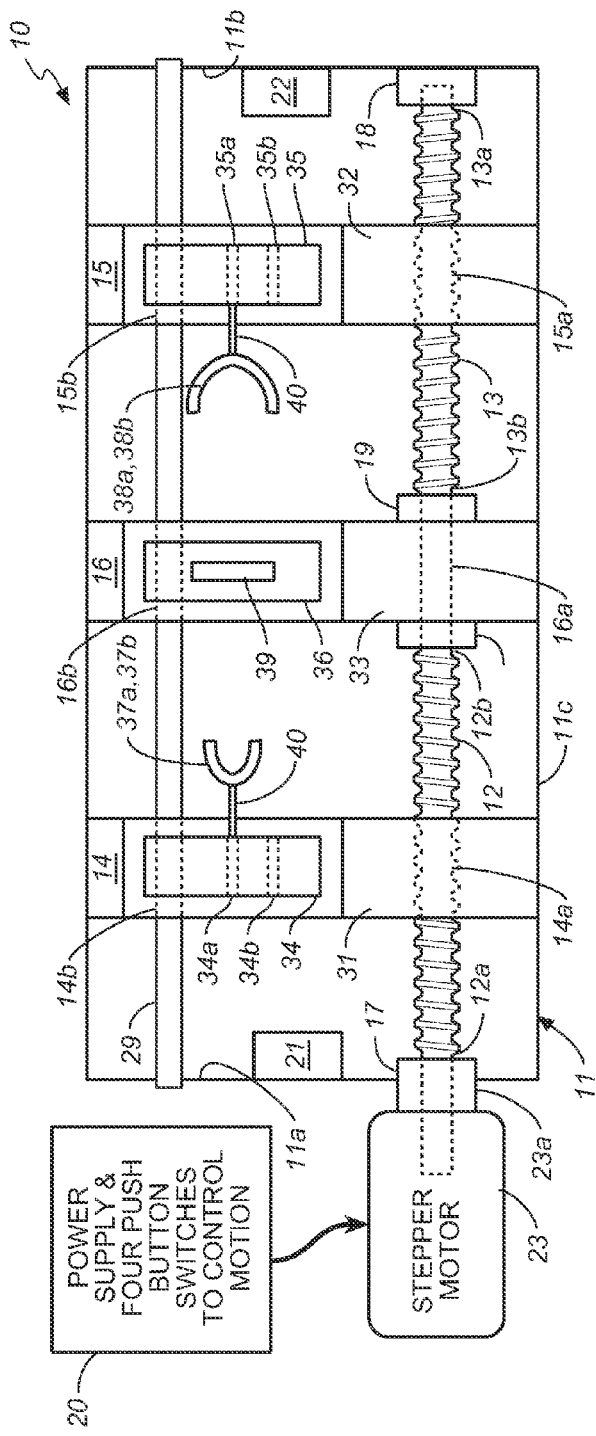
FIG. 1 is a schematic top plan view in elevation of the preferred embodiment of the apparatus of the present invention.

DRAWING REFERENCE NUMERALS 11 non-ferrous box or housing for holding the components of the apparatus, having a left wall 11a, a right wall 11b, and a base 11c.
12 left-handed drive screw having a first end 12a and a second end 12b.
13 right-handed drive screw having a first end 13a and a second end 13b.
14 left moving platform.
15 right moving platform.
16 center fixed (stationary) platform.
17 left coupling—connects left drive screw to drive shaft of stepper motor.
18 right journal or bushing—supports screw assembly and facilitates smooth motion of drive screw.
19 center coupling—connects left- and right-handed drive screws.
21 left limit switch.
22 right limit switch.
23 DC stepper motor—drives screw assembly.
24 push-button switch (PBS) controls platform continuous motion toward magnet.
25 PBS controls platform continuous motion away from magnet.
26 PBS controls platform intermittent/step motion toward magnet.
27 PBS controls platform intermittent/step motion away from magnet.
29 stabilizing rod passing through three platforms to keep platform motion smooth and aligned.
31 magnetically inert base support on left moving platform.
32 magnetically inert base support on right moving platform.
33 magnetically inert base support on center fixed platform.
34 magnetically inert stage on left moving platform to support either of first or second pairs of horseshoe(s) 37a, 37b, and 38a, 38b, mounted in alignment with the geometric center of magnet 39.
35 magnetically inert stage on right moving platform to support either of first or second pairs of horseshoe(s) 37a, 37b, and 38a, 38b, mounted in alignment with the geometric center of magnet 39.
36 magnetically inert stage on center (fixed) platform to support magnet 39.
37a, 37b first set of ferrous metal horseshoes having no curved ends ("twist"), each of the first pair having a width less than the width of magnets 39.

38a, 38b second set of ferrous metal horseshoes, this pair having a width greater than the diameter of the magnet, and having a twist on each end 38', 38" (i.e., a curvature at each of the ends), one end curving (twisting) in a first direction and the other curving (twisting) in an opposite direction.

39 magnet.

40a, 40b support rods soldered to the apex of first and second pairs of horseshoes 37a, 37b, and 38a, 38b, respectively, and pivotally disposed in bore holes 34a, 35a.

DETAILED DESCRIPTION OF THE INVENTION

Referring to FIGS. 1 through 4B wherein like reference numerals refer to like components in the various views. There is illustrated therein a new and improved apparatus to demonstrate that a magnetic field produces magnetic field-curves, and not magnetic field-lines. The apparatus is generally denominated 10 herein.

Figure 2:
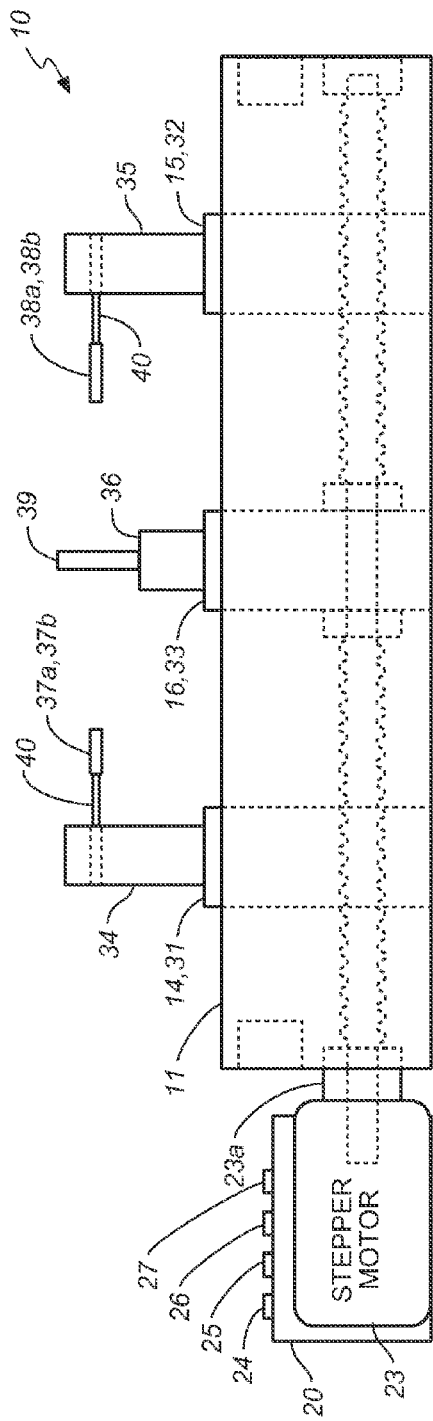
FIG. 2 is a cross-sectional side view in elevation showing the inventive apparatus fully assembled.
Figure 3A:
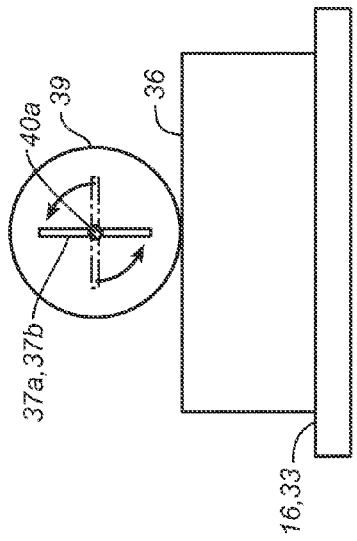
FIG. 3A is a side view in elevation showing a portion of the inventive apparatus, including a left moving platform with one horseshoe of a first pair of horseshoes mounted thereon, said horseshoe having a width less than the diameter of the magnet.
Figure 3B:
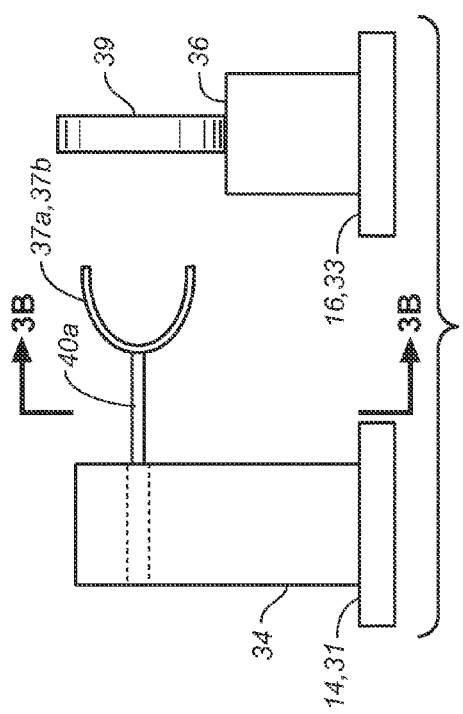
FIG. 3B is an end view in elevation thereof, showing the orientation of the horseshoe in relation to the disc magnet.

FIGS. 1 and 2 show the essential elements of the simple assembly of the preferred embodiment of the inventive apparatus. The views, top plan and side elevational, respectively, show that the apparatus is fabricated and set in a non-ferrous box or housing 11, having a base 11c, and left and right walls, 11a, 11b, respectively. The housing may be fabricated from a non-ferrous metal or from other magnetically inert materials. The housing supports a number of structural and operative components that achieve the observational results. Firstly, there is a left-handed (clockwise threaded) drive screw 12 threadably disposed through a first (left) platform 14, and, secondly, a right-handed (counterclockwise threaded) drive screw 13 through a second (right) moving platform 15. The first and second moving platforms 14 and 15 move in a back and forth manner within housing 11, being very slightly spaced apart from the top surface of the base 11c or slidingly in contact with the surface of the base. The left and right moving platforms further have left-hand and right-hand female helical threading 14a, 15a to complement the male helically threaded first and second (left-handed and right-handed, respectively) drive screws 12, 13, so as to permit a smooth reciprocal motion of the platforms axially along the length of their respective drive screws. Both first and second drive screws 12 and 13 are connected to a coupler 19 journaled and rotatably set and installed on either non-ferrous bearings or a bushing (not shown) disposed inside a bore 16a extending through a fixed (stationary) platform 16. Alternatively, the coupling may be disposed in the bore 16a and conditioned for very low friction rotation within the bore, such as by conditioning and/or smoothing the surface of the coupling and the bore. The fixed platform 16 is permanently secured atop the based 11c of housing 11.

The left-handed drive screw 12 is connected at a first end 12a to a coupling 17, which is, in turn connected to the drive shaft 23a of a stepper motor 23. The second end 12b of the left-handed drive screw 12 is connected to coupling 19. The right-handed drive screw 13 is rotatably connected at a first end 13a to a bearing or bushing assembly 18 mounted on the inside of the housing, and connected at its second end 13b to coupling 19.

To prevent the moving platforms 14, 15 from travelling beyond the useful limits in either direction, two limit switches 21 and 22 are disposed on the inside of the right and left walls 11a, 11b of the housing 11. The limit switches may be contact switches or proximity switches. Steeper motor 23 rotates the drive screws in the desired directions. Power for the motor and system is provided by an electrical power supply. The stepper motor is provided with four push button switches 24, 25, 26, 27 controlling the directions of motion. For the observations and demonstration of interest, four kinds of motion are required from the motor; two continuous motions, one forward and one reverse; and two intermittent step motions, again one forward and another reverse.

To maintain a continuous and smooth motion of the platforms, and to prevent any undesirable wobbling in the platforms caused by imperfections in the balance or geometry of the platform configurations or the drive system, a smooth stabilizing rod 29 is inserted through the moving and fixed platforms. The stabilizing rod is connected (and preferably fixed) at its first and second ends, 29a, 29b to housing 11, and is disposed through stabilizing rod holes 14b, 15b, 16b in platforms 14, 15, 16. Rod 29 is preferably fabricated from stainless steel and may be provided with light lubrication to ensure that the moving platforms slide very smoothly to balance and stabilize the moving platforms as they move in relation to the center stationary platform.

To isolate the magnet and its effects on the horseshoes, magnetically inert plastic supports 31, 32 and 33, respectively, are installed on each of the left-hand moving platform 14, right-hand moving platform 15, and fixed platform 17. Left, right, and center stages, 34, 35 and 36, respectively, are installed, on each of the respective left, right and center supports, 31, 32, 33 to function as supports for the horseshoes and the magnet. Alternatively, the platforms themselves can function as supports.

A magnet 39, preferably a neodymium disc magnet, is mounted on center stage 36. A magnet with a 0.01 tesla (100 gauss) magnetic flux density reading has been shown to be more than suitable for small bench top laboratory scale demonstrations.

Referring next to FIGS. 3A-4B, as well as to FIGS. 1 and 2 as before, two types of horseshoe specimens are provided, both fabricated from a ferrous material such as iron. Each shoe of a first pair of shoes 37a, 37b, has a generally planar top and bottom side, and a width (measured from the insides of the ends of the horseshoe at the open heel portion) smaller than the diameter of the disc shaped magnet. This configuration is used to observe the turning and twisting of the magnetic field curves in continuous motions. The second pair of horseshoes 38a, 38b, also has generally planar top and bottom sides, but a width (measured at the inside of the ends of the open heel portion) greater than the diameter of the magnet, and ends having a twist or curvature, including a first end 38'—curving (twisting) in a first direction and the other end 38" curving (twisting) in the opposite direction. This configuration and dimensional geometry is used to observe the turning and twisting of the curves in step motions.

For the continuous motion observations, left and right horseshoes 37a and 37b are connected to a mounting rod 40a which extends radially from the apex (center) of the toe portion of the horseshoe in the plane of the flat sides of the shoe. The mounting rod is pivotally passed through and mounted within bore holes 34a, 35a, drilled in stages 34 and 35. Magnet 39 is securely mounted on stage 36. With the poles of the magnet oriented so as to be directly facing the left and right horseshoes, the alignment holes 34a, 35a in the stages are positioned so as to substantially align the axial center line of the mounting rods with the geometric center of the magnet. To observe only the turning of the magnetic field-curves, the centerline of the horseshoes is aligned with the center of the magnet. If such an alignment is not achieved, anomalous and inaccurate effect may be displayed as the magnetic field-curves turn and have torsion (twists.)

Figure 4A:
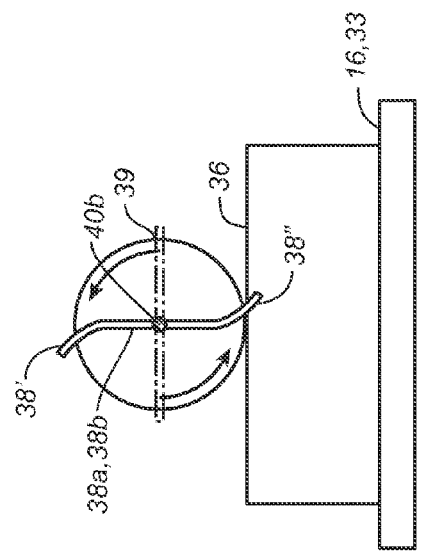
FIG. 4A is a side view in elevation showing a portion of the inventive apparatus, including a left moving platform with one horseshoe of a second pair of horseshoes mounted thereon, said horseshoe having a width greater than the diameter of the magnet and having ends twisting in opposite directions, one toward the viewer and out from the plane of the paper and the other away from the viewer to the rear of the plane of the paper (as seen more clearly in FIG. 4B)
Figure 4B:
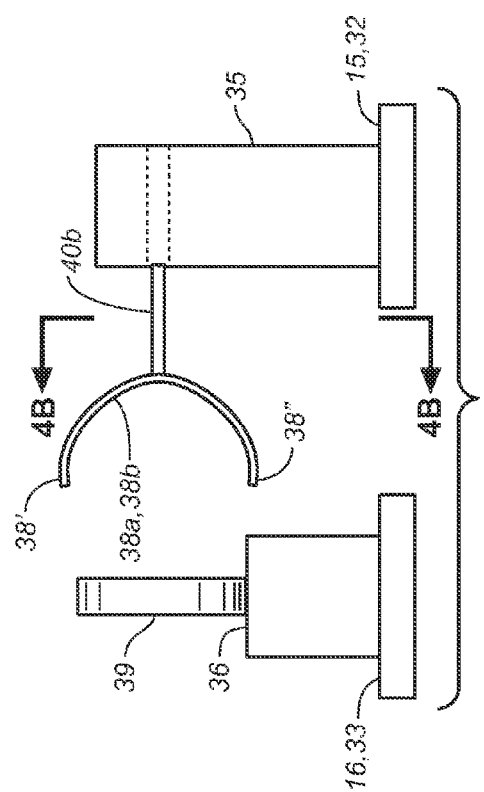
FIG. 4B is an end view in elevation thereof, showing the horseshoe of FIG. 4A with "twisted" ends and their relationship to the disc magnet mounted nearby.

For a second set of observations—viz., to observe the turning and torsion of the magnetic field-curves—the first set of horseshoes is removed and a second set of horseshoes 38a and 38b are provided (see esp., FIGS. 4A-4B). In the case of the second set of horseshoes, the width of the horseshoes is greater than the diameter of the disc-shaped magnet.

Stages 34, 35 and 36 are provided with bore holes 34a, 35a, which also permit alignment of the support rod 40b and apex of the horseshoes with the geometric center of the magnet. Again, support rod 40b freely turns in each of the bore holes. A second set of bore holes 34b, 35b can be provided for differing sizes of horseshoes so as to facilitate easier alignment.

With the second set of horseshoes mounted, the reciprocating and incremental step motions are initiated, and when so doing, one can observe the turning and twisting (torsion) motions of the horseshoes, thus demonstrating that the magnetic field-curves turn and have twists (torsions).

The above disclosure is sufficient to enable one of ordinary skill in the art to practice the invention, and provides the best mode of practicing the invention presently contemplated by the inventor. While there is provided herein a full and complete disclosure of the preferred embodiments of this invention, it is not desired to limit the invention to the exact construction, dimensional relationships, and operation shown and described. Various modifications, alternative constructions, changes and equivalents will readily occur to those skilled in the art and may be employed, as suitable, without departing from the true spirit and scope of the invention. Such changes might involve alternative materials, components, structural arrangements, sizes, shapes, forms, functions, operational features or the like. For instance, a spherical magnet may be employed rather than a disc-shaped magnet, and as long at the poles can be properly aligned, such a variation has proven practicable.

Therefore, the above description and illustrations should not be construed as limiting the scope of the invention, which is defined by the appended claims.

What is claimed as invention is:

1. A scientific instrument for demonstrating features of the magnetic field, comprising:
    a housing having left and right walls and a base;
    a first moving platform having a threaded bore with threads of a first handedness;
    a second moving platform having a threaded bore with threads having a handedness opposite said first handedness threads of said threaded bore of said first moving platform;
    a fixed center platform disposed between said first and second moving platforms and having a coupler hole;
    a left drive screw having threads complementary to the threaded bore of said first moving platform, said left drive screw having a first end operatively connected to a drive shaft of an electric motor and a second end connected to a shaft coupler disposed in said coupler hole;
    a right drive screw having threads complementary to the threaded bore of said second moving platform, said right drive screw having a first end rotatably connected to a shaft support and a second end connected to said coupler;
    a first mounting stage disposed atop said first moving platform, said first mounting stage having at least one alignment hole;
    a second mounting stage disposed atop said second moving platform, said second mounting state having at least one alignment hole;
    a third mounting stage disposed atop said fixed center platform;
    a magnet mounted on said third mounting stage;
    at least one pair of generally planar ferrous horseshoes, each of said horseshoes having a mounting rod connected to and extending radially from the apex of said horseshoe in the plane of the horseshoe and pivotally disposed in an alignment hole in one of said first and second mounting stages;
    wherein said first and second moving platforms are spaced substantially the same distance apart from said fixed center platform either of said left drive screw or said right drive screw, and further wherein when said electric motor can be operated in a forward or reserve direction, and when so operated, said first and second horseshoes pivot on said mounting rod so as to demonstrate features of the magnetic field surrounding said magnet.

2. The scientific instrument of claim 1, wherein said first moving platform, said second moving, and said fixed center platform have axially aligned stabilizing holes through which at a stabilizing rod is slidably disposed, wherein said first and second moving platforms move reciprocally along the length of said stabilizing rod.

3. The scientific instrument of claim 1, wherein said at least one pair of generally planar ferrous horseshoes includes a pair of horseshoes having a width, as measured from the inside tips of the ends of the horseshoe at the open end of the heel portion of the horseshoe, that is less than the diameter of said magnet, said horseshoes for observing the turning and twisting of the curves using continuous motions.

4. The scientific instrument of claim 1, wherein said at least one pair of generally planar ferrous horseshoes includes a pair of horseshoes having a width, as measured from the inside tips of the ends of the horseshoe at the open end of the heel portion of the horseshoe, that is greater than the diameter of said magnet, said horseshoes for observing the turning and tortion of magnetic field curves using incremental motions.

5. The scientific instrument of claim 4 wherein said pair of horseshoes includes a first end that twists in a first direction away from the plane of the horseshoe and a second end that twists in a second direction opposite that of the first direction.

6. The scientific instrument of claim 1, wherein said at least one pair of generally planar ferrous horseshoes includes a first pair of horseshoes having a width, as measured from the inside tips of the ends of the horseshoe at the open end of the heel portion of the horseshoe, that is less than the diameter of said magnet, and a second pair of horseshoes having a width, as measured from the inside tips of the ends of the horseshoe at the open end of the heel portion of the horseshoe, that is greater than the diameter of said magnet.

7. The scientific instrument of claim 1, wherein said housing is fabricated from magnetically inert material.

8. The scientific instrument of claim 1, wherein said first, second and fixed center platforms are fabricated from magnetically inert material.

9. The scientific instrument of claim 1, wherein said electric motor is a stepper motor includes a motor controller having a plurality of motion controls, including, at least, a first direction of continuous motion and a first direction of incremental/stepped motion.

10. The scientific instrument of claim 9, wherein said motor controller includes a control for forward continuous motion, reverse continuous motion, forward incremental motion, and reverse incremental motion.

11. The scientific instrument of claim 1, further including at least one limit switch disposed on one of said right and left walls of said housing, said limit switch stopping said electric motor when either of said first or second moving platform makes contact with, or comes into sufficiently close proximity with, said limit switch.

12. The scientific instrument of claim 1, further including a magnetically inert support disposed between said first moving platform and said first mounting stage and a second magnetically inert support disposed between said second moving platform and said second mounting stage.

13. A method of demonstrating and observing that a magnetic field includes field-curves that have torsional features, said method comprising the steps of:
(a) providing a measurement instrument including a housing with left and right walls and a base, a first moving platform having a threaded bore with threads of a first handedness, a second moving platform having a threaded bore with threads having a handedness opposite the first handedness threads of the threaded bore of the first moving platform, a fixed center platform disposed between the first and second moving platforms and having a coupler hole, a left drive screw having threads complementary to the threaded bore of the first moving platform, the left drive screw having a first end operatively connected to a drive shaft of an electric motor and a second end connected to a shaft coupler disposed in the coupler hole, a right drive screw having threads complementary to the threaded bore of the second moving platform, said right drive screw having a first end rotatably connected to a shaft support and a second end connected to the coupler, a first mounting stage disposed atop the first moving platform, the first mounting stage having at least one alignment hole, a second mounting stage disposed atop the second moving platform, the second mounting stage having at least one alignment hole, a third mounting stage disposed atop the fixed center platform, a magnet mounted on the third mounting stage, at least one pair of generally planar ferrous horseshoes, each of the horseshoes having a mounting rod connected to and extending radially from the apex of the horseshoe in the plane of the horseshoe and pivotally disposed in an alignment hole in one of the first and second mounting stages, wherein the first and second moving platforms are spaced substantially the same distance apart from the fixed center platform either of the left drive screw or the right drive screw, and further wherein when the electric motor can be operated in a forward or reserve direction, and when so operated, the first and second horseshoes pivot on the mounting rod so as to demonstrate features of the magnetic field surrounding the magnet;
(b) moving the first and second moving platforms along the left and right drive screws in a reciprocating manner.

14. The method of claim 13, wherein the at least one pair of generally planar ferrous horseshoes includes a pair of horseshoes having a width, as measured from the inside tips of the ends of the horseshoe at the open end of the heel portion of the horseshoe, that is less than the diameter of the magnet, and wherein step (b) includes moving the left and right moving platforms continuously toward and away from the magnet.

15. The method of claim 13, wherein the at least one pair of generally planar ferrous horseshoes includes a pair of horseshoes having a width, as measured from the inside tips of the ends of the horseshoe at the open end of the heel portion of the horseshoe, that is greater than the diameter of the magnet, and includes a first end that twists in a first direction away from the plane of the horseshoe and a second end that twists in a second direction opposite that of the first direction, and the electric motor is a stepper motor, and wherein step (b) includes moving the left and right moving platforms incrementally toward and away from the magnet.

* * * * *